(12) United States Patent
Gohara et al.

(10) Patent No.: US 9,720,052 B2
(45) Date of Patent: Aug. 1, 2017

(54) MAGNETIC SENSOR DRIVE CIRCUIT, MAGNETIC SENSOR, CURRENT SENSOR, AND METHOD FOR DRIVING MAGNETIC SENSOR

(71) Applicant: FUJIKURA LTD., Tokyo (JP)

(72) Inventors: Miyako Gohara, Sakura (JP); Kenichi Ohmori, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/904,134

(22) PCT Filed: Jul. 17, 2014

(86) PCT No.: PCT/JP2014/069058
§ 371 (c)(1),
(2) Date: Jan. 11, 2016

(87) PCT Pub. No.: WO2015/008835
PCT Pub. Date: Jan. 22, 2015

(65) Prior Publication Data
US 2016/0161570 A1 Jun. 9, 2016

(30) Foreign Application Priority Data
Jul. 18, 2013 (JP) .................................. 2013-149453

(51) Int. Cl.
*G01N 27/72* (2006.01)
*G01R 33/00* (2006.01)
(Continued)

(52) U.S. Cl.
CPC ......... *G01R 33/0041* (2013.01); *G01R 19/00* (2013.01); *G01R 33/02* (2013.01); *G01R 33/04* (2013.01); *G01R 15/148* (2013.01)

(58) Field of Classification Search
CPC ........... G01N 27/9053; G01N 27/9046; G01N 27/82; G01N 27/906; G01N 27/023;
(Continued)

(56) References Cited

U.S. PATENT DOCUMENTS

| 5,200,701 A | * | 4/1993 | Siebold | ................ G01R 33/385 324/309 |
| 6,388,440 B1 | * | 5/2002 | Nagaishi | ............ G01R 33/0356 324/248 |

(Continued)

FOREIGN PATENT DOCUMENTS

| JP | 3-150485 A | 6/1991 |
| JP | 2001-121974 A | 5/2001 |

OTHER PUBLICATIONS

Notice of Allowance of Japanese Application No. 2013-149453 dated May 7, 2015.

*Primary Examiner* — Thang Le
(74) *Attorney, Agent, or Firm* — Sughrue Mion, PLLC (57) ABSTRACT

A magnetic sensor drive circuit that measures a magnetic field by passing a feedback current, which cancels changes in magnetic flux density using measured magnetic field, through a prescribed coil. The drive circuit includes: a first circuit block which controls the feedback current by using an external power source as a power source; a second circuit block which has an output adjustment circuit adjusting a signal according to the strength of the feedback current to be a signal proportional to the voltage of the power source; a first power source line which supplies the external power source to the first circuit block; a second power source line which supplies the external power source to the second circuit block in parallel to the first power source line; a first low pass filter; and a second low pass filter.

7 Claims, 7 Drawing Sheets

(51) Int. Cl.
*G01R 33/02* (2006.01)
*G01R 19/00* (2006.01)
*G01R 33/04* (2006.01)
*G01R 15/14* (2006.01)

(58) Field of Classification Search
CPC .... G01N 27/72; G01R 33/12; G01R 33/1223; G01R 31/025; G01R 31/08; G01R 31/088; G01R 31/085; G01R 31/024; G01D 5/145; G01D 5/2448; G01D 5/2033; G01D 5/2013; G01B 7/023; G01B 7/14; G01B 7/003
USPC ... 324/225, 207.11–207.17, 207.2, 234, 239, 324/260, 522
See application file for complete search history.

(56) References Cited

U.S. PATENT DOCUMENTS

| | | | |
|---|---|---|---|
| 6,501,241 B1 | 12/2002 | Tsurumi et al. | |
| 2011/0140716 A1* | 6/2011 | Wang | G01N 27/025 324/654 |
| 2011/0241665 A1* | 10/2011 | Takatsuji | G01R 33/0023 324/253 |
| 2013/0214777 A1* | 8/2013 | Itoi | G01C 17/30 324/252 |
| 2014/0285189 A1* | 9/2014 | Kashmiri | G01R 33/04 324/253 |

\* cited by examiner

MAGNETIC SENSOR DRIVE CIRCUIT, MAGNETIC SENSOR, CURRENT SENSOR, AND METHOD FOR DRIVING MAGNETIC SENSOR

CROSS REFERENCE TO RELATED APPLICATIONS

This application is a National Stage of International Application No. PCT/JP2014/069058 filed on Jul. 17, 2014, claiming priority based on Japanese Patent Application No. 2013-149453 filed on Jul. 18, 2013, the contents of all of which are incorporated herein by reference in their entirety.

TECHNICAL FIELD

The present invention relates to a magnetic sensor drive circuit, a magnetic sensor, a current sensor, and a method for driving the magnetic sensor.

BACKGROUND ART

In a sensor, voltage of an output signal is changed proportionally to variation of the voltage of a power source. Typically the output is referred to as ratiometric output. In the case of ratiometric output, an error of a reference voltage generated between the sensor and a measuring unit is automatically corrected by using the same power source voltage as the power source voltage of the sensor as the reference voltage in the measuring unit (that is, an analog/digital converter (A/D) converter). PTL 1 discloses an example of a current sensor which has such a ratiometric output. According to the current sensor described in PTL 1, it is possible to measure a current value with good precision regardless of the variation of the power source voltage in combination with the A/D converter which uses the same power source voltage.

In addition, the current sensor described in PTL 1 senses the current using a magnetic sensor that uses a Hall element. That is, the current sensor senses a value of a measured current by sensing a magnetic field generated by the measured current using the Hall element. Meanwhile, a flux gate-type magnetic sensor, which is a well-known technology, is a magnetic sensor that does not use the Hall element. In the flux gate-type magnetic sensor, alternating current flows in an excitation coil which is wound on a magnetic core, and the magnetic core is periodically saturated. Then, a measured external magnetic field (hereinafter referred to as a "measured magnetic field") is applied with respect to the magnetic core. When the external magnetic field is applied, a time interval of the magnetic saturation changes. The external magnetic field is measured using the phenomenon in which the time interval is changed. In the flux gate-type magnetic sensor, there is a sensor in which the external magnetic field is measured by directly measuring the time interval at which the magnetic saturation occurs, and there is a sensor in which the external magnetic field is measured by a feedback current flowing such that the time interval is a predetermined value in the coil which is wound on the magnetic core. The latter sensor is referred to as a closed-loop magnetic sensor, performs feedback control such that the external magnetic field is canceled, and passes current through a predetermined coil according to the external magnetic field.

CITATION LIST

Patent Literature

[PTL 1] Japanese Unexamined Patent Application, First Publication No. 2001-121974

SUMMARY OF INVENTION

Technical Problem

In the closed-loop magnetic sensor such as described above, accompanying an increase of the external magnetic field, current consumption (mainly feedback current) increases. Meanwhile, in the sensors, there are cases where a low-pass filter is inserted as a countermeasure to variation (noise) of a short period of a power supply voltage line. When the low-pass filter is inserted in the power source line of the closed-loop magnetic sensor, the influence of a voltage drop increases due to a direct current resistance component of an inductor of the low-pass filter accompanying the increase in current consumption. That is, even if the direct current voltage input to the low-pass filter is constant, the direct current voltage output from the low-pass filter drops accompanying the increase in current consumption. In this case, when the output of the closed-loop magnetic sensor is set as ratiometric output, an output signal voltage of the sensor causes a drop in voltage even if the power source voltage of the measuring unit is constant due to the drop in power source voltage occurring accompanying the increase in current consumption (that is, the drop in output voltage of the low-pass filter). In this case, since the drop in voltage changes according to the size of the current consumption, the current consumption reduces in a small range, and the current consumption increases in a large range. That is, since the size of an error changes dependent on the size of the current consumption, a problem occurs in that an output linearity error worsens.

It is possible to reduce the output linearity error by using an inductor with a small direct current resistance component Rdc. However, the inductor with a small direct current resistance component Rdc is very large in comparison to a chip inductor with a relatively large direct current resistance component, and is expensive. That is, there are problems of size and cost.

Considering the circumstances above, advantageous aspects of the present invention aim to provide a magnetic sensor drive circuit, a magnetic sensor, a current sensor, and a method for driving the magnetic sensor which are able to reduce an output linearity error of ratiometric output in a case where the current consumption of the sensor is changed according to a measured physical quantity.

Solution to Problem

According to an aspect of the present invention, a magnetic sensor drive circuit is provided that measures a magnetic field by passing feedback current, which cancels a change in magnetic flux density using a measured magnetic field, through a predetermined coil, including a first circuit block which controls the feedback current which is passed through the predetermined coil, has a feedback current control circuit which outputs a signal according to the strength of the feedback current, and passes the feedback current using an external power source, which is input from an external power source input terminal, as the power source, a second circuit block which has a ratiometric control circuit which monitors the voltage of the power source and an output adjustment circuit which adjusts and outputs a signal, according to the strength of the feedback current, to a signal which is proportional to the voltage of the power source, a first power source line which supplies the external power source to the first circuit block, a second power source line which supplies the external power source to the second circuit block in parallel to the first power source line, a first low-pass filter inserted into the first power source line, and a second low-pass filter inserted into the second power source line.

In addition, in the magnetic sensor drive circuit, the first low-pass filter and the second low-pass filter may be LC filters which use a chip inductor and chip capacitor.

In addition, in the magnetic sensor drive circuit, the output adjustment circuit may output a signal which is proportional to the voltage of the power source using an amplifier circuit that uses a power source supplied from the second power source line as a voltage source.

According to an aspect of the present invention, a magnetic sensor is provided including a sensor part that has a magnetic core and a plurality of coils which are wound on the magnetic core, and a drive circuit which measures a magnetic field by passing feedback current, which cancels a change in magnetic flux density using a measured magnetic field that acts on a sensor part, through a predetermined coil out of the plurality of coils, the drive circuit including a first circuit block which controls the feedback current which is passed through the predetermined coil, has a feedback current control circuit which outputs a signal according to the strength of the feedback current, and passes the feedback current using an external power source, which is input from an external power source input terminal, as the power source, a second circuit block which has a ratiometric control circuit that monitors the voltage of the power source and an output adjustment circuit which adjusts and outputs a signal according to the strength of the feedback current to a signal which is proportional to the voltage of the power source, a first power source line which supplies the external power source to the first circuit block, a second power source line which supplies the external power source to the second circuit block in parallel to the first power source line, a first low-pass filter inserted into the first power source line, and a second low-pass filter inserted into the second power source line.

According to an aspect of the present invention, a current sensor is provided including a sensor part which has a magnetic core and a plurality of coils which are wound around the magnetic core, a current flow path part that causes the sensor part to generate a magnetic field according to a measured current, and a drive circuit which measures a magnetic field by passing feedback current that cancels a change in magnetic flux density using a measured magnetic field that acts on a sensor part, through a predetermined coil out of the plurality of coils, the drive circuit including a first circuit block which controls the feedback current that is passed through the predetermined coil, has a feedback current control circuit which outputs a signal according to the strength of the feedback current, and passes the feedback current using an external power source, which is input from an external power source input terminal, as the power source, a second circuit block which has a ratiometric control circuit that monitors the voltage of the power source and an output adjustment circuit which adjusts and outputs a signal according to the strength of the feedback current to a signal which is proportional to the voltage of the power source, a first power source line which supplies the external power source to the first circuit block, a second power source line which supplies the external power source to the second circuit block in parallel to the first power source line, a first low-pass filter inserted into the first power source line, and a second low-pass filter inserted into the second power source line.

According to an aspect of the present invention, a method is provided for driving a magnetic sensor which measures a magnetic field by passing feedback current, which cancels a change in magnetic flux density using a measured magnetic field, through a predetermined coil, including using a first circuit block which controls the feedback current which is passed through the predetermined coil, has a feedback current control circuit which outputs a signal according to the strength of the feedback current, and passes the feedback current using an external power source input from an external power source input terminal as the power source, and a second circuit block which has a ratiometric control circuit that monitors the voltage of the power source and an output adjustment circuit which adjusts and outputs a signal according to the strength of the feedback current to a signal which is proportional to the voltage of the power source, supplying the external power source to the first circuit block using a first power source line into which a first low-pass filter is inserted, and supplying the external power source to the second circuit block in parallel to the first power source line using a second power source line into which a second low-pass filter is inserted.

Advantageous Effects of Invention

According to each aspect of the present invention, the first power source line supplies the external power source that is input from the external power source input terminal with respect to the first circuit block through which the feedback current passes, and the second power source line supplies the external power source to the second circuit block which has the ratiometric control circuit that monitors the voltage of the power source and the output adjustment circuit which adjusts and outputs a signal according to the strength of the feedback current to a signal which is proportional to the voltage of the power source. In addition, the first low-pass filter and the second low-pass filter are respectively inserted in the first power source line and the second power source line. Accordingly, the direct current resistance component of the first low-pass filter on the first circuit block side through which the feedback current passes reduces the influence which is exerted on the second circuit block side, and it is possible to improve the output linearity of the ratiometric output.

DESCRIPTION OF EMBODIMENTS

Figure 1:
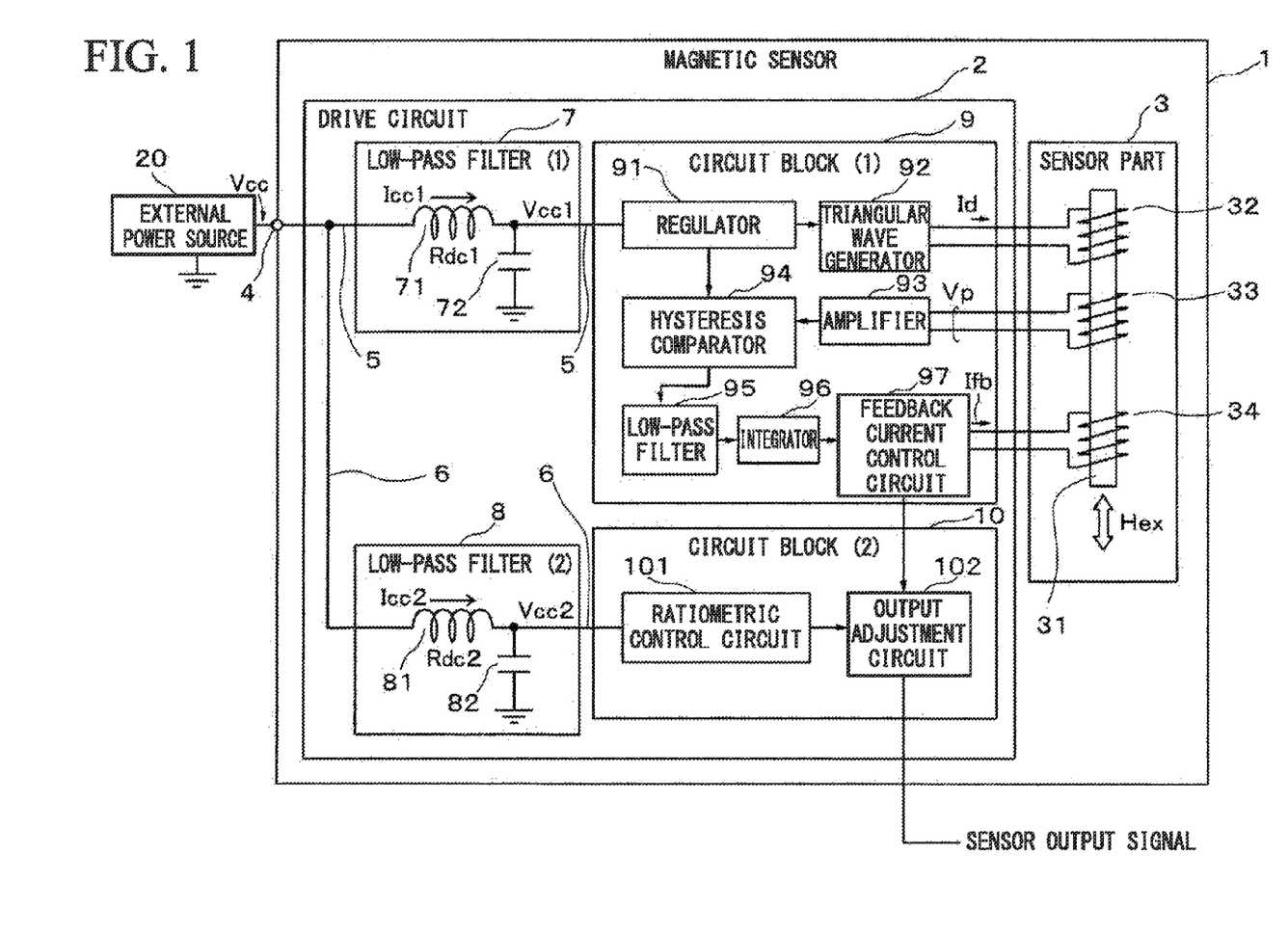
FIG. 1 is an outline block diagram describing a configuration of a magnetic sensor 1 and a drive circuit 2 for the magnetic sensor 1 according to a first embodiment of the present invention.

Embodiments of the present invention will be described below with reference to the drawings. FIG. 1 is a block diagram illustrating a configuration example of a magnetic sensor 1 according to a first embodiment of the present invention. In FIG. 1, the magnetic sensor 1 is a closed-loop magnetic sensor of a flux gate-type, and is provided with a drive circuit 2 and a sensor part 3. The drive circuit 2 is provided with an external power source input terminal 4, a first power source line 5, a second power source line 6, a first low-pass filter 7, a second low-pass filter 8, a first circuit block 9, and a second circuit block 10. The sensor part 3 is provided with a magnetic core 31, an excitation coil 32, a pick-up coil 33, and a feedback coil 34. The magnetic sensor 1 indicated in FIG. 1 operates a direct current voltage Vcc supplied from an external power source 20 as the power source, measures a magnetic field Hex by passing a feedback current Ifb to the feedback coil 34 according to the measured magnetic field Hex applied to the sensor part 3, and outputs a sensor output signal at a ratiometric output according to the magnetic field Hex.

In the sensor part 3, the magnetic core 31 is a member which has, for example, a form of a cylindrical shape, a ring-shape, or a frame shape made from a high magnetic permeability material. The excitation coil 32, the pick-up coil 33, and the feedback coil 34 are wound on an outer peripheral surface of the magnetic core 31. The measured magnetic field Hex is a magnetic field through which a cylindrical space passes that is formed by the excitation coil 32, the pick-up coil 33, and the feedback coil 34. The measured magnetic field Hex is, for example, a magnetic field which is geomagnetic, and is a magnetic field generated by a current which flows along a current flow path (current flow path part) made from a metal plate or conductive cable which is disposed in the vicinity of the magnetic core 31 that is not illustrated. The current flow path part is provided so as to pass through a hollow part of the magnetic core 31 which has, for example, a form of a ring shape or a frame shape, the measured current passes along the current flow path part, and it is possible to generate the measured magnetic field Hex in the sensor part 3 according to the measured current, and operate the magnetic sensor 1 as a current sensor by sensing the measured magnetic field Hex.

In the drive circuit 2, the external power source input terminal 4 is a terminal into which a direct current power source output of the external power source 20 is input (that is, a terminal which is connected to a constant voltage source of the external power source 20). The first power source line 5 is a wiring through which the direct current power source output of the external power source 20 that is input from the external power source input terminal 4 is supplied to the first circuit block 9. The second power source line 6 is a wiring through which the direct current power source output of the external power source 20 that is input from the external power source input terminal 4 is supplied to the second circuit block 10 in parallel with the first power source line 5. The first low-pass filter 7 is inserted into the first power source line 5. In addition, the second low-pass filter 8 is inserted into the second power source line 6.

The first low-pass filter 7 has an inductor 71 and a capacitor 72, and configures an LC filter. The second low-pass filter 8 has an inductor 81 and a capacitor 82, and configures an LC filter. A cutoff frequency of the low-pass filter is set according to a calculation and an experimental result such that high-frequency noise which is superimposed on the direct current power source that is input from the external power source 20 attenuates to a desired value. Here, the inductance of the inductor 71 may be the same or different from the inductance of the inductor 82. An electrostatic capacity of the capacitor 81 may be the same or different from the electrostatic capacity of the capacitor 82. In addition, the inductor 71 and the inductor 81 or the capacitor 72 and the capacitor 82 can be set as a chip inductor or a chip capacitor which are surface mounted components. In this case, it is possible to simply reduce a mounting area or volume. In addition, the configurations of the first low-pass filter 7 and the second low-pass filter 8 are not limited to one subsequent LC filter, and may be multiple subsequent filters; furthermore, it is possible to be set as an LRC filter which is connected to a resistor in series, or set as an RC filter in place of the inductor in the resistor. In addition, the filter configuration of the first low-pass filter 7 and the second low-pass filter 8 may be the same, or may be different.

Here, in FIG. 1, the output current voltage of the external power source 20 is set as Vcc, a direct current resistance component of the inductor 71 is set as Rdc1, a direct current which flows in the inductor 71 is set as Icc1, and the output direct current voltage of the first low-pass filter 7 is set as Vcc1. In addition, a direct current resistance component of the inductor 81 is set as Rdc2, a direct current which flows in the inductor 81 is set as Icc2, and the output direct current voltage of the second low-pass filter 8 is set as Vcc2. The current Icc1 is current consumption of the first circuit block 9. Then, the current Icc2 is current consumption of the second circuit block 10.

The first circuit block 9 has a regulator 91, a triangular wave generator 92, an amplifier 93, a hysteresis comparator 94, a low-pass filter 95, an integrator 96, and a feedback current control circuit 97. The first circuit block 9 is a circuit through which the feedback current Ifb passes the direct current output of the external power source 20 that is input from the external power source input terminal 4 to the feedback coil 34 as the power source, and is a circuit block in which the current consumption Icc1 is dependent on the measured magnetic field (or the measured current).

The regulator 91 inputs the direct current output of the external power source 20 via the first low-pass filter 7, and converts and outputs the direct current output as one or a plurality of predetermined constant voltages. The output of the regulator 91 is used as a power source voltage or a reference voltage in each unit within the first circuit block 9.

Figure 2:
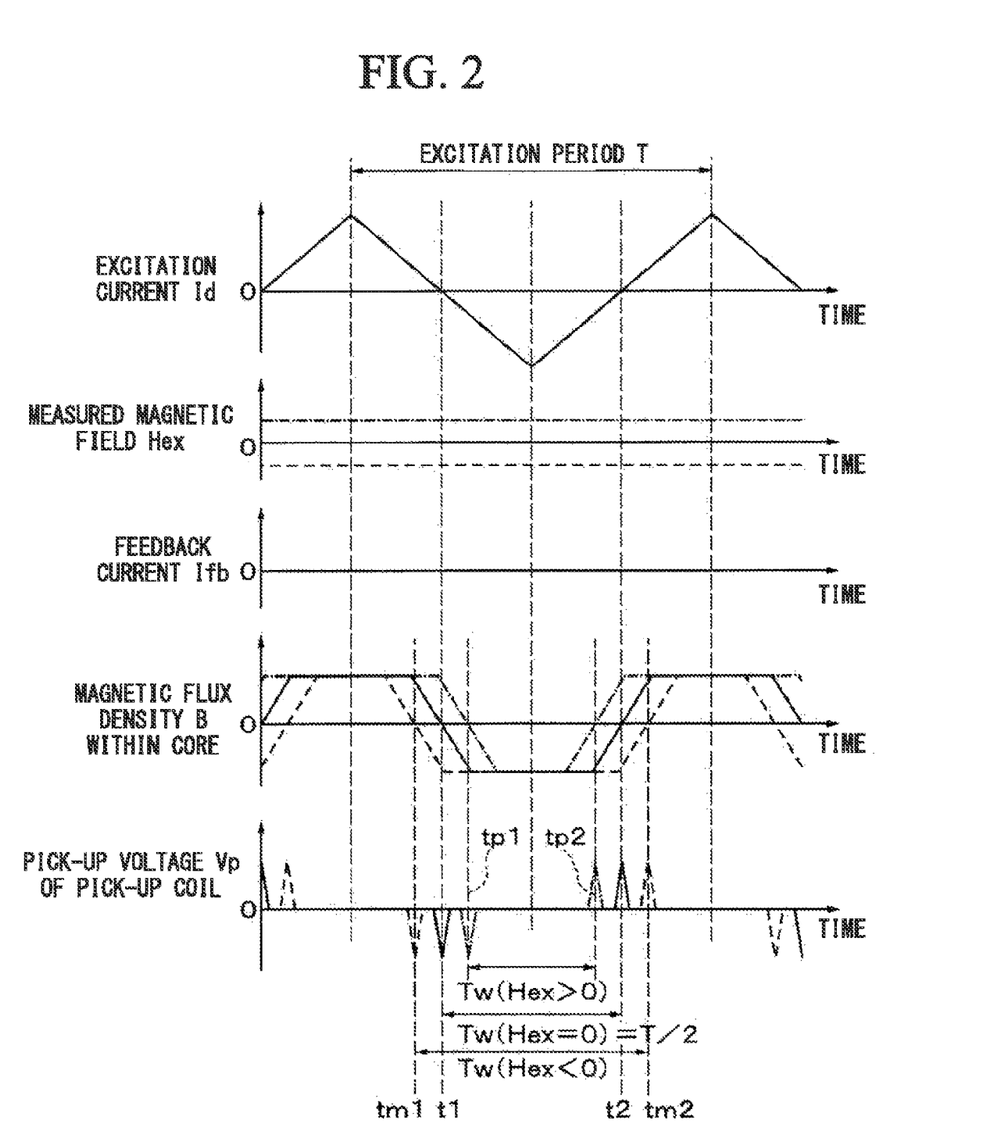
FIG. 2 is a waveform chart describing an operation of a sensor part 3 in FIG. 1.

In the triangular wave generator 92, an alternating excitation current Id with a triangular shape passes through the excitation coil 32 at a constant excitation period T indicated in FIG. 2. FIG. 2 is a waveform chart illustrating an operation waveform of each unit of the sensor part 3. The horizontal axis is time, and each waveform in order from the top is the excitation current Id which flows in the excitation coil 32, the measured magnetic field Hex applied to the magnetic core 31, the feedback current Ifb which flows in the feedback coil 34, a magnetic flux density B within the magnetic core 31, and a pick-up voltage Vp generated in the pick-up coil 33. The triangular wave generator 92 controls the excitation current Id such that the magnetic core 31 is magnetically saturated. FIG. 2 indicates the magnetic flux density B and the pick-up voltage Vp respectfully using a chain line, a solid line, and a broken line in a case where the measured magnetic field Hex is larger than 0 (a waveform illustrated using the chain line), in a case of being equal to 0 (a waveform illustrated using the solid line), and a case of being smaller than 0 (a waveform illustrated using the broken line). However, FIG. 2 illustrates a waveform in a case where a value 0 is constant without the feedback current Ifb flowing.

In the case in which the measured magnetic field Hex=0, the magnetic flux density B is a target waveform that is positive or negative as indicated by a solid line. The pick-up voltage Vp is generated as a waveform with a negative pulse form and a positive pulse form respectively indicating, using a solid line, a time t1 and a time t2 in which a reference numeral of the magnetic flux density B is switched. A period Tw (Hex=0) between the time t1 and the time t2 is a value of 1 of the two parts of the excitation period T.

In a case where the measured magnetic field Hex>0, as indicated by the chain line, the magnetic flux density B is a waveform which is raised on the positive side in comparison to the waveform when Hex=0. The pick-up voltage Vp is generated as a waveform with a negative pulse form and a positive pulse form respectively indicating, using a chain line, a time tp1 and a time tp2 in which the reference numeral of the magnetic flux density B is switched. The period Tw (Hex>0) between the time tp1 and the time tp2 is a smaller value than 1 of the two parts of the excitation period T.

Then, in a case where the measured magnetic field Hex<0, as indicated by the broken line, the magnetic flux density B is a waveform which is lowered on the negative side in comparison to the waveform when Hex=0. The pick-up voltage Vp is generated as a waveform with a negative pulse form and a positive pulse form respectively indicating, using a broken line, a time tm1 and a time tm2 in which the reference numeral of the magnetic flux density B is switched. A period Tw (Hex<0) between the time tm1 and the time tm2 is a value greater than 1 of the two parts of the excitation period T.

The amplifier 93 increases the pick-up voltage Vp generated in the pick-up coil 33.

The hysteresis comparator 94 converts the output signal of the amplifier 93 to a rectangular wave signal. For example, the hysteresis comparator 94 sets the time Tw from the negative pulse to the positive pulse of the pick-up voltage Vp indicated in FIG. 2 as a low level (L level), sets other time as high level (H level), and outputs the rectangular wave signal in which one period is the excitation period T. In this case, a duty ratio of the rectangular wave signal which the hysteresis comparator 94 outputs (that is, a proportion of the time of the H level per period) corresponds to the value of the measured magnetic field Hex.

The low-pass filter 95 outputs a smooth waveform of the voltage according to the duty ratio of the rectangular wave that is obtained via the hysteresis comparator 94.

The integrator 96 is a circuit which acts as an integral element in the feedback control, and outputs a signal corresponding to a command value of the feedback current Ifb by integrating a deviation between the output voltage of the current low-pass filter 95 and the output voltage of the low-pass filter 95 in which the duty ratio of the rectangular wave is 50% (that is, the duty ratio corresponding to the case in which the measured magnetic field Hex=0). That is, the integrator 96 outputs a signal corresponding to the command value of the feedback current Ifb such that the duty ratio of the rectangular wave obtained via the hysteresis comparator 94 is 50%. In this case, the integrator 96 generates the command value of the feedback current Ifb such that the change of the magnetic flux density B within the magnetic core 31 that is generated due to the application of the measured magnetic field Hex is canceled.

Figure 3:
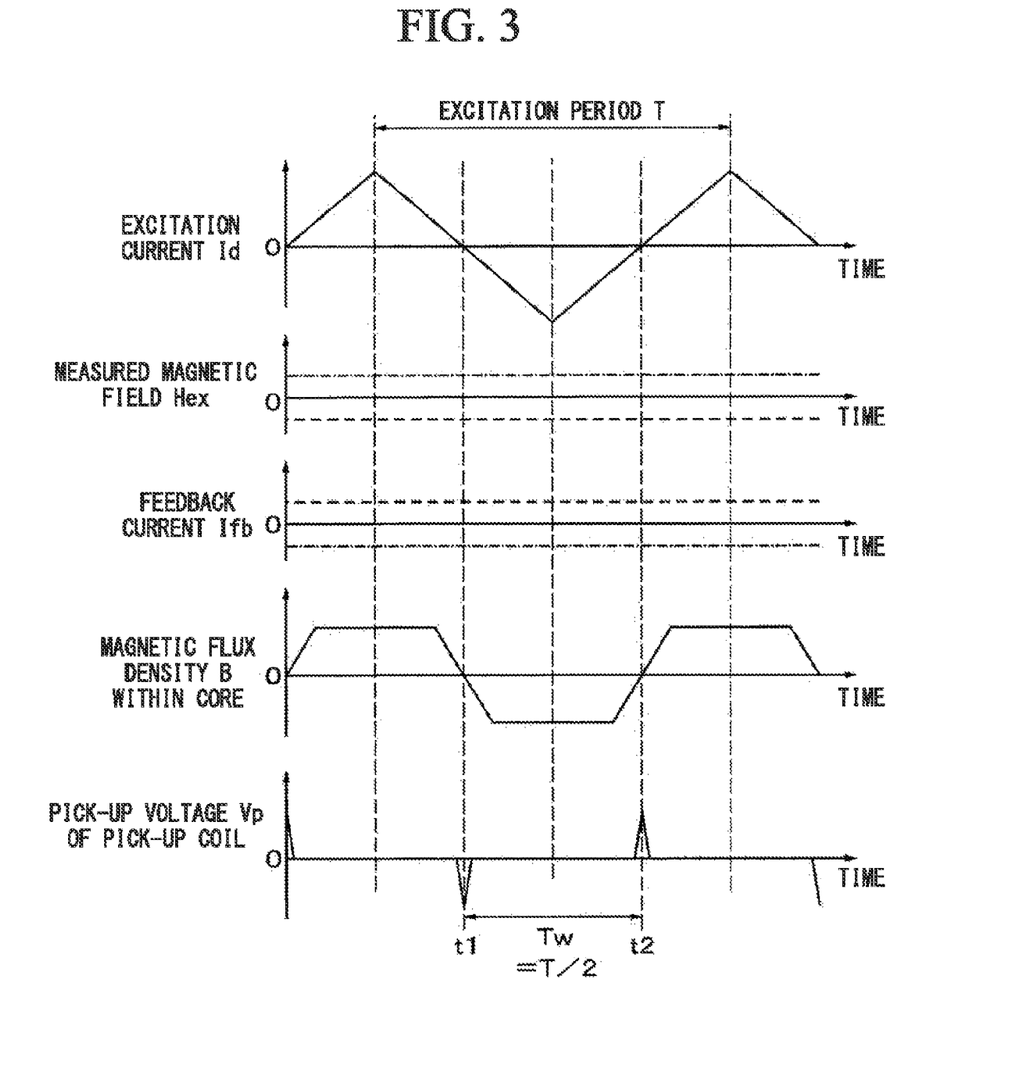
FIG. 3 is another waveform chart describing an operation of the sensor part 3 in FIG. 1.

The feedback current control circuit 97 controls the feedback current Ifb which passes current through the feedback coil 34 according to the output signal of the integrator 96, and outputs the signal according to the strength of the feedback current Ifb with respect to the output adjustment circuit 102 of the second circuit block 10. FIG. 3 is a waveform chart of each unit of the sensor part 3 in a case where the feedback current Ifb is passed through. The format of the waveform chart is the same as FIG. 2. In a case where Hex>0 where the measured magnetic field Hex is indicated using the chain line, the feedback current Ifb is controlled such that Ifb, indicated by the chain line, <0. Meanwhile, in a case where Hex<0 where the measured magnetic field Hex is indicated using the broken line, the feedback current Ifb is controlled such that Ifb, indicated by the broken line, >0. Thereby, the magnetic flux density B within the magnetic core 31 is controlled so as to be the same as the case where the measured magnetic field Hex=0. Consequently, the period Tw between the time t1 in which a waveform with the negative pulse form of the pick-up voltage Vp is generated and the time t2 in which the waveform with the positive pulse form is generated is a value of substantially 1 of the two parts of the excitation period T. In the state where the period Tw is a value of substantially 1 of the two parts of the excitation period T, the feedback current Ifb is a value according to the measured magnetic field Hex.

Meanwhile, in FIG. 1, the second circuit block 10 has a ratiometric control circuit 101 and an output adjustment circuit 102. The second circuit block 10 is a circuit block in which the current consumption Icc2 is almost completely independent of the measured magnetic field (or the measured current).

The ratiometric control circuit 101 monitors the power source voltage Vcc2 output from the second low-pass filter 8, and outputs a signal in which a coefficient that is set in advance is multiplied by the power source voltage Vcc2. For example, it is possible to configure the ratiometric control circuit 101 using a digital processing circuit that performs multiplication processing on an A/D converter. For example, the ratiometric control circuit 101 outputs a digital signal corresponding to 0.5×Vcc2 where the coefficient is 0.5.

The output adjustment circuit 102 adjusts the value of the output signal of the feedback current control circuit 97 to a value which is proportional to the power source voltage Vcc2 based on the output signal of the ratiometric control circuit 101, and outputs the value as a sensor output signal. For example, it is possible to configure the output adjustment circuit 102 using an A/D converter or a D/A converter (digital/analog converter), a digital processing circuit which performs multiplication processing and addition processing, and an output stage amplifier circuit. However, it is possible to omit the A/D converter in a case where the feedback current control circuit 97 outputs a signal according to the strength of the feedback current Ifb as a digital signal. In addition, it is possible to set an output stage operational amplifier circuit (that is, a buffer amplifier or an operational amplifier which outputs the sensor output signal proportionally to the power source voltage Vcc2) as an amplifier circuit which has a so-called rail-to-rail output characteristic that operates the power source voltage Vcc2 supplied from the second power source line 6 as the power source. In this case, it is possible for a voltage range of the sensor output signal to be in a range from 0 V to substantially the power source voltage Vcc2, and it is possible to widen the voltage range more easily than a case where the power source voltage Vcc1 supplied from the first power source line 5 is set as the power source.

For example, in a case where the power source voltage Vcc2 is 5 V, the output adjustment circuit 102 outputs the output signal in which a value from a minimum value (negative value) of the feedback current Ifb to a value that corresponds to the maximum value (positive value) is adjusted to 0 V to 5 V. In this case, for example, when the power source voltage Vcc2 is changed to 4.8 V, the output adjustment circuit 102 outputs the output signal in which the value from the minimum value (negative value) of the feedback current Ifb to the value that corresponds to the maximum value (positive value) is adjusted to 0 V to 4.8 V. In addition, in this case, for example, when the power source voltage Vcc2 is changed to 5.2 V, the output adjustment circuit 102 outputs the output signal in which the value from the minimum value (negative value) of the feedback current Ifb to the value that corresponds to the maximum value (positive value) is adjusted to 0 V to 5.2 V.

In addition, it is also possible for the output adjustment circuit 102 to limit an upper limit and lower limit of the output voltage to a constant value. For example, in a case where the power source voltage Vcc2 is 5 V, it is possible for the output adjustment circuit 102 to output the output signal in which the value from the minimum value (negative value) of the feedback current Ifb to the value that corresponds to the maximum value (positive value) is adjusted to, for example, 0.5 V (=Vcc2×0.1) to 4.5 V (=Vcc2−Vcc2×0.1). In this case, for example, when the power source voltage Vcc2 is changed to 4.8 V, it is possible for the output adjustment circuit 102 to output the output signal in which the value from the minimum value (negative value) of the feedback current Ifb to a value that corresponds to the maximum value (positive value) is adjusted to 0.48 V (=Vcc2×0.1) to 4.32 V (=Vcc2−Vcc2×0.1). In addition, in this case, for example, when the power source voltage Vcc2 is changed to 5.2 V, it is possible for the output adjustment circuit 102 to output the output signal in which the value from the minimum value (negative value) of the feedback current Ifb to the value that corresponds to the maximum value (positive value) is adjusted to 0.52 V (=Vcc2×0.1) to 4.68 V (=Vcc2−Vcc2× 0.1).

In the configuration described above, since the current consumption Icc1 of the first circuit block 9 includes the feedback current Ifb, the size of the current consumption Icc1 is also changed when the feedback current Ifb is changed accompanying the change of the measured magnetic field Hex. Where Vcc1=Vcc−Icc1×Rdc1, the power source voltage Vcc1 of the first circuit block 9 drops accompanying an increase of Icc1. Meanwhile, where Vcc2=Vcc−Icc2×Rdc2, the power source voltage Vcc2 of the second circuit block 10 generates a voltage reduction due to Icc2 and Rdc2. However, the current consumption Icc2 of the second circuit block 10 does not include the feedback current Ifb. For this reason, it is possible to easily set the power source voltage Vcc2 of the second circuit block 10 to barely change even in a case where the feedback current Ifb is changed accompanying the change of the measured magnetic field Hex. In addition, it is possible to easily reduce the size of the current consumption Icc2 by not including the feedback current Ifb, and it is possible to easily reduce a difference between the power source voltage Vcc of the external power source 20 and the power source voltage Vcc2 of the second circuit block 10 (that is, a voltage drop due the direct current resistance component Rdc2). Accordingly, in a case where the sensor output signal is adjusted according to the power source voltage Vcc2, it is possible to easily improve linearity of the ratiometric output characteristic.

Figure 4:
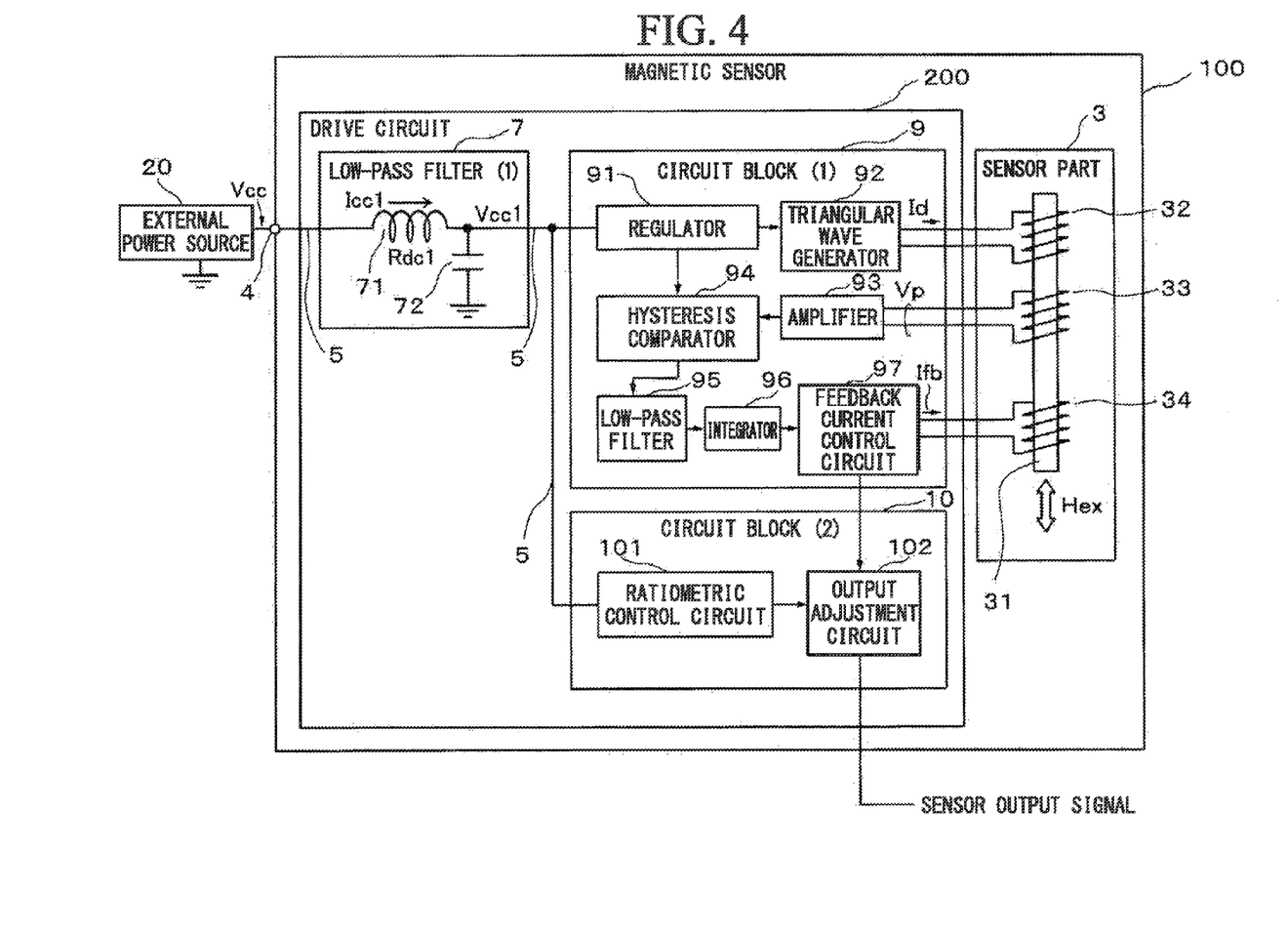
FIG. 4 is an outline block diagram describing a configuration of a magnetic sensor 100 that is used in comparison to when an effect of the magnetic sensor 1 in FIG. 1 is inspected.

Here, a reduction effect of an output linearity error according to the present embodiment will be described with reference to FIG. 4 and FIG. 5. FIG. 4 is a block diagram illustrating a circuit configuration of the magnetic sensor 100 that is used for comparison. The magnetic sensor 100 excludes the second low-pass filter 8 from the magnetic sensor 1 illustrated in FIG. 1, and is provided with a drive circuit 200 such that the output of the first low-pass filter 7 is supplied to the ratiometric control circuit 101. Here, other configurations are the same as the magnetic sensor 1 illustrated in FIG. 1 and are given the same reference numerals.

Figure 5:
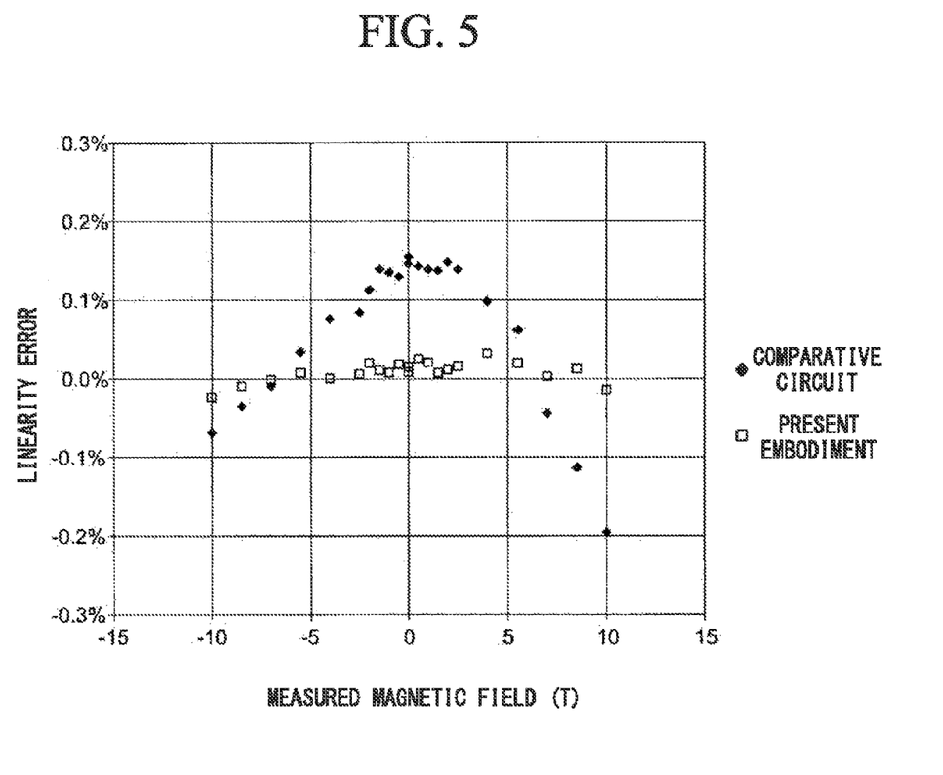
FIG. 5 is a graph indicating output characteristics of the magnetic sensor 1 in FIG. 1 and the magnetic sensor 100 in FIG. 4.

FIG. 5 is a graph which indicates the linearity error of the magnetic sensor 1 illustrated in FIG. 1 and the linearity error of the magnetic sensor 100 illustrated in FIG. 4. The linearity error of the magnetic sensor 1 illustrated in FIG. 1 is indicated by a white rectangle in the present embodiment, and the linearity error of the magnetic sensor 100 illustrated in FIG. 4 is indicated by a black rectangle as a comparative circuit. According to the change of the measured magnetic field on the horizontal axis, it is understood that the linearity error of the present embodiment is barely changed with respect to the linearity error of the comparative circuit greatly changing.

Figure 6:
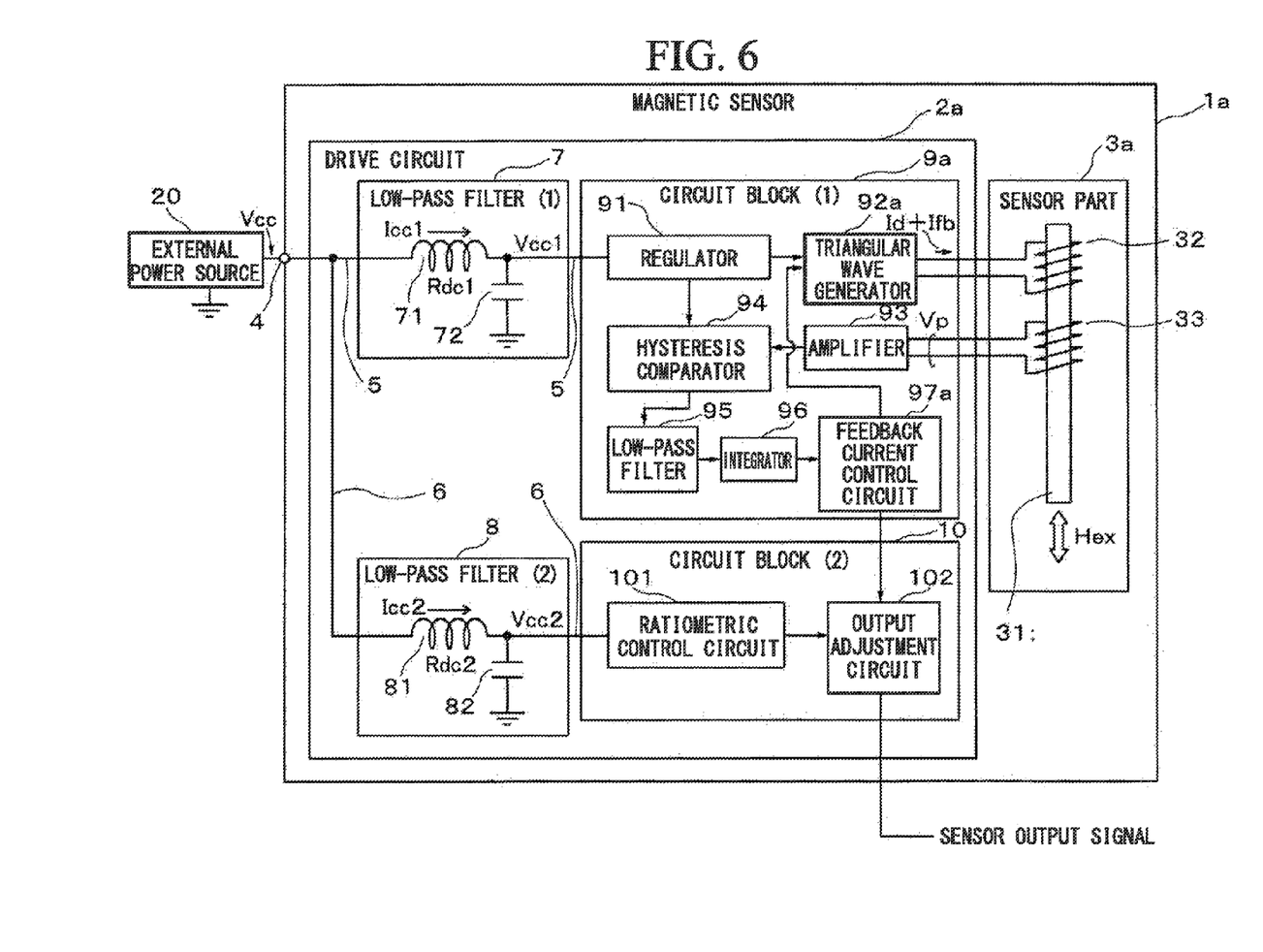
FIG. 6 is an outline block diagram describing a configuration of a magnetic sensor 1a and a drive circuit 2a for the magnetic sensor 1a according to a second embodiment of the present invention.
Figure 7:
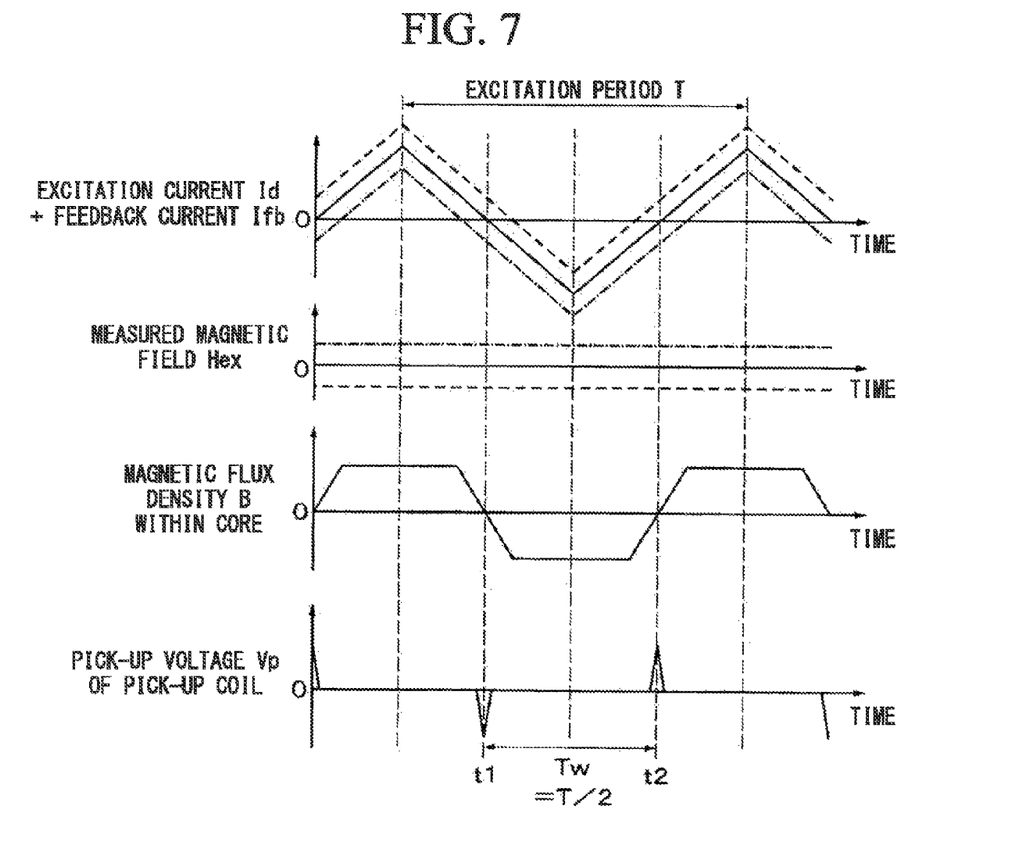
FIG. 7 is a waveform chart describing an operation of a sensor part 3a in FIG. 6.

Next, a second embodiment of the present invention will be described with reference to FIG. 6 and FIG. 7. In FIG. 6 and FIG. 7, the same reference numerals are used as in FIG. 1 and FIG. 3. FIG. 6 is a block diagram illustrating a configuration example of a magnetic sensor 1a according to the second embodiment of the present invention. In comparison to the magnetic sensor 1 illustrated in FIG. 1, the magnetic sensor 1a illustrated in FIG. 6 is different in omitting the feedback coil 34 illustrated in FIG. 1, and passing the feedback current Ifb through the excitation current Id and the excitation coil 32. That is, the sensor part 3a configured to correspond to the sensor part 3 illustrated in FIG. 1 is provided with the magnetic core 31, the excitation coil 32, and the pick-up coil 33. Then, the excitation coil 32 and the pick-up coil 33 are wound on an outer peripheral surface of the magnetic core 31.

The drive circuit 2a corresponding to the drive circuit 2 illustrated in FIG. 1 is provided with a first circuit block 9a in place of the first circuit block 9 illustrated in FIG. 1. The first circuit block 9a is provided with a triangular wave generator 92a and a feedback current control circuit 97a in place of the triangular wave generator 92 and the feedback current control circuit 97 illustrated in FIG. 1.

The triangular wave generator 92a passes a current through the excitation coil 32 which is added to the feedback current Ifb that corresponds to a command value of the feedback current Ifb input from the feedback current control circuit 97a to an alternating excitation current Id with a triangular shape at a constant excitation period T indicated in FIG. 7. FIG. 7 is a waveform chart illustrating an operation waveform of each unit of the sensor part 3a. The horizontal axis is time, and each waveform in order from the top is the current which flows in the excitation coil 32 (=excitation current Id+feedback current Ifb), the measured magnetic field Hex applied to the magnetic core 31, the magnetic flux density B within the magnetic core 31, and the pick-up voltage Vp generated in the pick-up coil 33. The triangular wave generator 92a controls the excitation current Id such that the magnetic core 31 is magnetically saturated, and passes a current through the excitation coil 32 which is added to the feedback current Ifb that corresponds to a command value of the feedback current Ifb input from the feedback current control circuit 97a.

Here, in the same manner as FIG. 2, FIG. 7 indicates the magnetic flux density B and the excitation current Id+the feedback current Ifb respectfully using a chain line, a solid line, and a broken line in a case where the measured magnetic field Hex is larger than 0 (a waveform illustrated using the chain line), in a case of being equal to 0 (a waveform illustrated using the solid line), and a case of being smaller than 0 (a waveform illustrated using the broken line).

The feedback current control circuit 97a controls the feedback current Ifb which passes current through the excitation coil 32 according to the output signal of the integrator 96 by adding to the excitation current Id by outputting the command value of the feedback current Ifb with respect to the triangular wave generator 92a, and outputs the signal according to the strength of the feedback current Ifb with respect to the output adjustment circuit 102 of the second circuit block 10. As indicated in FIG. 7, the period Tw between the time t1 in which a waveform with the negative pulse form of the pick-up voltage Vp is generated and the time t2 in which the waveform with the positive pulse form is generated is a value of substantially 1 of the two parts of the excitation period T due to the addition of the feedback current Ifb to the excitation current Id which is passed through the excitation coil 32 such that the change of the magnetic flux density B is canceled by the measured magnetic field Hex. In the state where the period Tw is a value of substantially 1 of the two parts of the excitation period T, the strength of the feedback current Ifb, which is input to the output adjustment circuit 102, is a value according to the measured magnetic field Hex.

In the magnetic sensor 1a illustrated in FIG. 6, in the same manner as the magnetic sensor 1 illustrated in FIG. 1, the current consumption Icc2 of the second circuit block 10 does not include the feedback current Ifb. For this reason, it is possible to easily set the power source voltage Vcc2 of the second circuit block 10 to barely change even in a case where the feedback current Ifb is changed accompanying the change of the measured magnetic field Hex. In addition, since it is possible to easily reduce the size of the current consumption Icc2, it is also possible to easily reduce the difference between the power source voltage Vcc of the external power source 20 and the power source voltage Vcc2 of the second circuit block 10. Accordingly, in a case where the sensor output signal is adjusted according to the power source voltage Vcc2, it is possible to easily improve linearity of the ratiometric output characteristic.

Here, the embodiment of the present invention is not limited to the description above, and it is possible to appropriately modify, for example, by providing a regulator in the same manner as the regulator 91 within the first circuit block 9 or the first circuit block 9a also within the second circuit block 10, configuring the ratiometric control circuit 101 and the output adjustment circuit 102 integrally, and configuring a portion of the configuration of the first circuit block 9 or the first circuit block 9a using a computer.

INDUSTRIAL APPLICABILITY

The present invention can be widely applied to a magnetic sensor drive circuit, a magnetic sensor, a current sensor, and a method for driving the magnetic sensor, and it is possible to reduce an output linearity error of a ratiometric output in a case where a current consumption of a sensor is changed according to a measured physical quantity.

REFERENCE SIGNS LIST 1, 1a MAGNETIC SENSOR
2, 2a DRIVE CIRCUIT
3, 3a SENSOR PART
4 EXTERNAL POWER SOURCE INPUT TERMINAL
5 FIRST POWER SOURCE LINE
6 SECOND POWER SOURCE LINE
7 FIRST LOW-PASS FILTER, LOW-PASS FILTER (1)
8 SECOND LOW-PASS FILTER, LOW-PASS FILTER (2)
9, 9a FIRST CIRCUIT BLOCK, CIRCUIT BLOCK (1)
10 SECOND CIRCUIT BLOCK, CIRCUIT BLOCK (2)
20 EXTERNAL POWER SOURCE
31 MAGNETIC CORE
32 EXCITATION COIL
33 PICK-UP COIL
34 FEEDBACK COIL
71, 81 INDUCTOR
72, 82 CAPACITOR
91 REGULATOR
92, 92a TRIANGULAR WAVE GENERATOR
93 AMPLIFIER
94 HYSTERESIS COMPARATOR
95 LOW-PASS FILTER
96 INTEGRATOR
97, 97a FEEDBACK CURRENT CONTROL CIRCUIT
101 RATIOMETRIC CONTROL CIRCUIT
102 OUTPUT ADJUSTMENT CIRCUIT

The invention claimed is:
1. A magnetic sensor drive circuit that measures a magnetic field by passing a feedback current, which cancels a change in magnetic flux density using the measured magnetic field, through a predetermined coil, the drive circuit comprising:
a first circuit block which controls the feedback current which is passed through the predetermined coil, has a feedback current control circuit which outputs a signal according to the strength of the feedback current which is passed through the predetermined coil, and passes the feedback current which is passed through the predetermined coil using an external power source, which is input from an external power source input terminal, as the power source;
a second circuit block which has a ratiometric control circuit that monitors a voltage of the power source and an output adjustment circuit which adjusts a value of the output signal of the feedback control circuit to a value which is proportional to the power source voltage based on an output signal of the ratiometric control circuit and outputs the value as a sensor output signal;
a first power source line which supplies the external power source to the first circuit block;
a second power source line which supplies the external power source to the second circuit block in parallel to the first power source line;
a first low-pass filter inserted into the first power source line; and
a second low-pass filter inserted into the second power source line.

2. The magnetic sensor drive circuit according to claim 1, wherein the first low-pass filter and the second low-pass filter are LC filters which use a chip inductor and chip capacitor.

3. The magnetic sensor drive circuit according to claim 1, wherein the output adjustment circuit outputs the signal which is proportional to the voltage of the power source using an amplifier circuit that uses a power source supplied from the second power source line as a voltage source.

4. A magnetic sensor comprising:
a sensor part that has a magnetic core and a plurality of coils which are wound on the magnetic core; and
a drive circuit which measures a magnetic field by passing a feedback current, which cancels a change in magnetic flux density using the measured magnetic field that acts on the sensor part, through a predetermined coil out of the plurality of coils,
the drive circuit includes:
a first circuit block which controls the feedback current which is passed through the predetermined coil, has a feedback current control circuit which outputs a signal according to the strength of the feedback current which is passed through the predetermined coil, and passes the feedback current which is passed through the predetermined coil using an external power source, which is input from an external power source input terminal, as the power source;
a second circuit block which has a ratiometric control circuit that monitors a voltage of the power source and an output adjustment circuit which adjusts a value of the output signal of the feedback control circuit to a value which is proportional to the power source voltage based on an output signal of the ratiometric control circuit and outputs the value as a sensor output signal;
a first power source line which supplies the external power source to the first circuit block;
a second power source line which supplies the external power source to the second circuit block in parallel to the first power source line;
a first low-pass filter inserted into the first power source line; and
a second low-pass filter inserted into the second power source line.

5. A current sensor comprising:
a sensor part which has a magnetic core and a plurality of coils which are wound around the magnetic core;
a current flow path part that causes the sensor part to generate a magnetic field according to a measured current; and
a drive circuit which measures the magnetic field by passing a feedback current that cancels a change in magnetic flux density using the measured magnetic field that acts on the sensor part, through a predetermined coil out of the plurality of coils,
the drive circuit includes:
a first circuit block which controls the feedback current that is passed through the predetermined coil, has a feedback current control circuit which outputs a signal according to the strength of the feedback current which is passed through the predetermined coil, and passes the feedback current which is passed through the predetermined coil using an external power source, which is input from an external power source input terminal, as the power source;
a second circuit block which has a ratiometric control circuit that monitors a voltage of the power source and an output adjustment circuit which adjusts a value of the output signal of the feedback control circuit to a value which is proportional to the power source voltage based on an output signal of the ratiometric control circuit and outputs the value as a sensor output signal;
a first power source line which supplies the external power source to the first circuit block;
a second power source line which supplies the external power source to the second circuit block in parallel to the first power source line;
a first low-pass filter inserted into the first power source line; and
a second low-pass filter inserted into the second power source line.

6. A method for driving a magnetic sensor which measures a magnetic field by passing a feedback current, which cancels a change in magnetic flux density using the measured magnetic field, through a predetermined coil, the method comprising:
using a first circuit block which controls the feedback current which is passed through the predetermined coil, has a feedback current control circuit which outputs a signal according to the strength of the feedback current which is passed through the predetermined coil, and passes the feedback current which is passed through the predetermined coil using an external power source which is input from an external power source input terminal as the power source, and a second circuit block which has a ratiometric control circuit that monitors a voltage of the power source and an output adjustment circuit which adjusts a value of the output signal of the feedback control circuit to a value which is proportional to the power source voltage based on an output signal of the ratiometric control circuit and outputs the value as a sensor output signal;
supplying the external power source to the first circuit block using a first power source line into which a first low-pass filter is inserted; and
supplying the external power source to the second circuit block in parallel to the first power source line using a second power source line into which a second low-pass filter is inserted.

7. The magnetic sensor drive circuit according to claim 2, wherein the output adjustment circuit outputs the signal which is proportional to the voltage of the power source using an amplifier circuit that uses a power source supplied from the second power source line as a voltage source.

* * * * *